(12) United States Patent
Hsu et al.

(10) Patent No.: US 8,729,660 B2
(45) Date of Patent: May 20, 2014

(54) MEMS INTEGRATED CHIP WITH CROSS-AREA INTERCONNECTION

(75) Inventors: Hsin-Hui Hsu, Hsin-Chu (TW); Chuan-Wei Wang, Hsin-Chu (TW); Sheng-Ta Lee, Hsin-Chu (TW)

(73) Assignee: Pixart Imaging Inc., Hsin-Chu (TW)

( * ) Notice: Subject to any disclaimer, the term of this patent is extended or adjusted under 35 U.S.C. 154(b) by 0 days.

(21) Appl. No.: 13/214,709

(22) Filed: Aug. 22, 2011

(65) Prior Publication Data

US 2011/0298136 A1 Dec. 8, 2011

Related U.S. Application Data

(62) Division of application No. 12/464,375, filed on May 12, 2009.

(51) Int. Cl.
*H01L 21/70* (2006.01)
*H01L 29/84* (2006.01)

(52) U.S. Cl.
USPC .... 257/508; 257/415; 257/506; 257/E27.001; 257/E21.575; 257/E29.324

(58) Field of Classification Search
USPC .......... 257/415, 499, 506, 508, E27.001, 257/E21.575, E29.324
See application file for complete search history.

(56) References Cited

U.S. PATENT DOCUMENTS

| | | | |
|---|---|---|---|
| 5,734,192 A * | 3/1998 | Sengle et al. | 257/506 |
| 6,744,112 B2 * | 6/2004 | Johnson et al. | 257/491 |
| 6,853,067 B1 * | 2/2005 | Cohn et al. | 257/704 |
| 6,861,686 B2 | 3/2005 | Lee et al. | |
| 7,037,745 B2 * | 5/2006 | Ouellet | 438/53 |
| 7,193,289 B2 | 3/2007 | Adkisson et al. | |
| 7,205,623 B2 | 4/2007 | Hong et al. | |
| 7,342,268 B2 | 3/2008 | Adkisson et al. | |
| 7,400,003 B2 | 7/2008 | Lee et al. | |
| 7,462,507 B2 | 12/2008 | Lee et al. | |
| 2004/0150070 A1 * | 8/2004 | Okada et al. | 257/508 |
| 2007/0262366 A1 | 11/2007 | Baek et al. | |

* cited by examiner

*Primary Examiner* — Allison P Bernstein
(74) *Attorney, Agent, or Firm* — Tung & Associates

(57) ABSTRACT

The present invention discloses a MEMS (Micro-Electro-Mechanical System) integrated chip with cross-area interconnection, comprising: a substrate; a MEMS device area on the substrate; a microelectronic device area on the substrate; a guard ring separating the MEMS device area and the microelectronic device area; and a conductive layer on the surface of the substrate below the guard ring, or a well in the substrate below the guard ring, as a cross-area interconnection electrically connecting the MEMS device area and the microelectronic device area.

3 Claims, 4 Drawing Sheets

MEMS INTEGRATED CHIP WITH CROSS-AREA INTERCONNECTION

This is a divisional of a co-pending application Ser. No. 12/464,375, filed on May 12, 2009.

FIELD OF INVENTION

The present invention relates to a Micro-Electro-Mechanical System (MEMS) integrated chip and a wiring structure of this system chip.

DESCRIPTION OF RELATED ART

MEMS devices are used in a wide variety of products such as micro-acoustical sensor, gyro-sensor, accelerometer, etc. A MEMS typically includes a MEMS device and other microelectronic devices which are integrated into an integrated chip. FIG. 1A is a top view showing the layout of a prior art MEMS chip. The integrated chip includes a MEMS device area 100 and a microelectronic device area 200 (including, e.g., CMOS devices). The MEMS device area 100 is surrounded by a guard ring 120 to protect the microelectronic device area 200 from damages due to the etching process in manufacturing the MEMS devices.

Referring to 1B, which is a cross-section view along the line A-A of FIG. 1A. During the manufacturing process of the microelectronic devices and the MEMS device, multiple dielectric layers 20 are deposited (interfaces between layers not shown). In this prior art, a movable MEMS device (not shown) is formed in the MEMS device area by etching the dielectric layer 20; thus, a space 10 is left in the MEMS device area 100. As mentioned earlier, the etching of the dielectric layer 20 should not damage the microelectronic device area 200. Therefore, a guard ring 120 is provided, which includes a polysilicon layer 12, a contact layer 13, a first metal layer 14, via layers 15a-15c, and other metal layers 16a-16c. The number of the via layers and metal layers may be determined according to the requirement for interconnection of the microelectronic devices and the design of the MEMS device.

In order to functionally connect the microelectronic devices and the MEMS device, an electrical connection must be provided therebetween. The foregoing prior art achieves this connection by means of one or more metal layers, such as the first metal layer 14 shown in FIG. 1B. However, such one or more metal layers must go through the guard ring 120, and the positions where they go through the guard ring 120 can not form a tightly closed structure with other portions of the guard ring 120 (i.e. the contact layer 13, via layer 15a, and the rest of the first metal layer 14 in the drawing); otherwise, it causes short circuit. Therefore, in this prior art, the microelectronic device area 200 can not be completely prevented from being damaged in the etching process for forming the MEMS device.

Accordingly, it is highly desired to provide a wiring structure which functionally connects the MEMS device and the microelectronic devices but still maintains the completeness of the guard ring structure.

SUMMARY OF THE INVENTION

An objective of the present invention is to provide a MEMS integrated chip with specially designed cross-area interconnection for electrically connecting the MEMS device area and the microelectronic device area to solve the foregoing problem.

In order to achieve the foregoing objective, in one perspective of the present invention, it provides an integrated MEMS chip with cross-area interconnection, comprising: a substrate; a MEMS device area on the substrate; a microelectronic device area on the substrate; and a guard ring separating the MEMS device area and the microelectronic device area, the guard ring including a structural layer on the substrate and a contact layer on the structural layer, wherein the contact layer is for a cross-area interconnection electrically connecting the MEMS device area and the microelectronic device area.

In another perspective of the present invention, it provides a MEMS integrated chip with cross-area interconnection, comprising: a substrate; a MEMS device area on the substrate; a microelectronic device area on the substrate; a guard ring separating the MEMS device area and the microelectronic device area; and a conductive layer on a surface of the substrate below the guard ring, as a cross-area interconnection electrically connecting the MEMS device area and the microelectronic device area.

In a third perspective of the present invention, it provides a MEMS integrated chip with cross-area interconnection, comprising: a substrate; a MEMS device area on the substrate; a microelectronic device area on the substrate; a guard ring separating the MEMS device area and the microelectronic device area; and a well in the substrate below the guard ring, as a cross-area interconnection electrically connecting the MEMS device area and the microelectronic device area.

The foregoing MEMS integrated chip can include both the aforementioned conductive layer and the aforementioned well.

Preferably, the guard ring of the foregoing MEMS integrated chip includes a structural layer with dielectric function on the substrate; a preferable material of the structural layer is undoped polysilicon.

In the foregoing MEMS integrated chip, the well can extend under the MEMS device area.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustration only, to show the interrelationships between the process steps and between the layers, but not drawn according to actual scale.

Figure 1A:
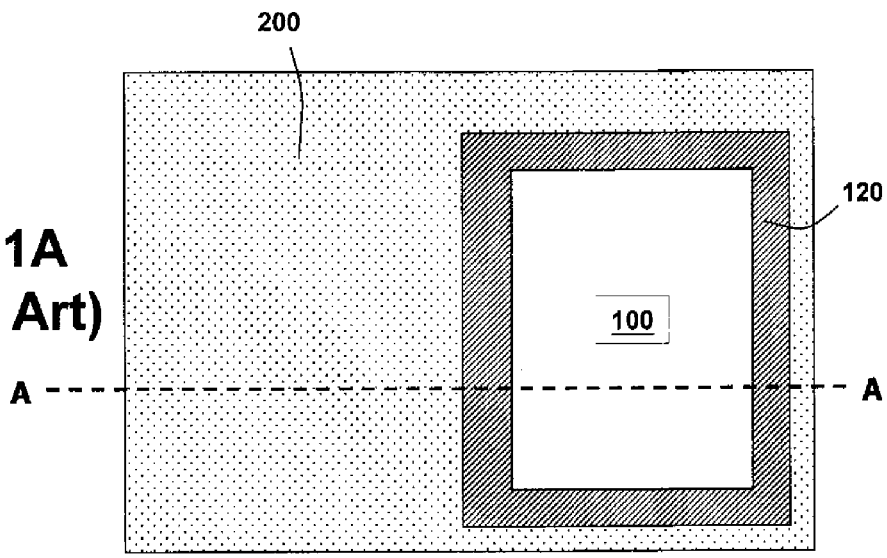
FIGS. 1A-1B shown the layout and cross section of a prior art MEMS chip.
Figure 1B:
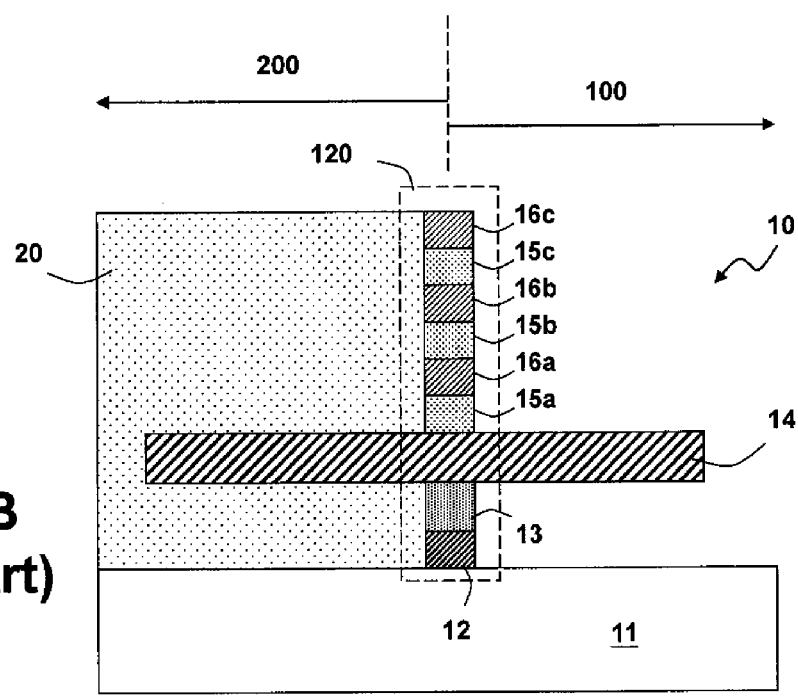
Figure 2:
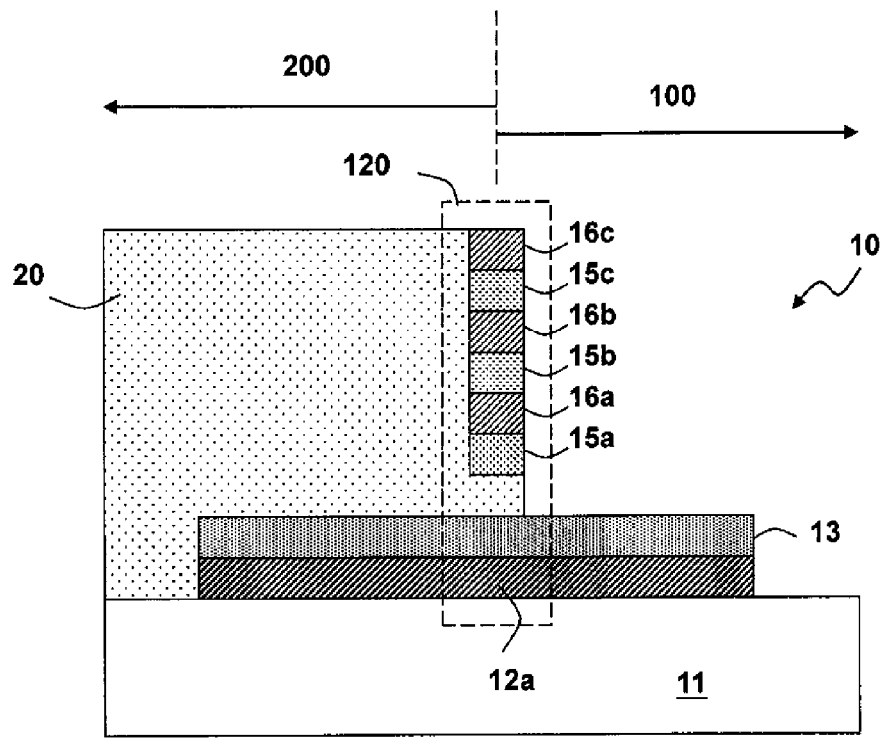
FIGS. 2-7 show six embodiments of the present invention, respectively.

FIG. 2 illustrates the first embodiment of the present invention. In this embodiment, a contact layer 13 is provided as a cross-area interconnection between a MEMS device and a microelectronic device (such as a CMOS device), and a lowest structural layer 12a is used for electrical isolation to prevent short circuit between the contact layer 13 and the substrate 11. The structural layer 12a for example can be an undoped polysilicon layer or a layer made of any other material capable of providing electrical isolation. In a preferred embodiment, the contact layer 13 is used as a conducting wire (connection line, not only a plug) in the MEMS device area 100 or the microelectronic device area, or both.

Figure 3:
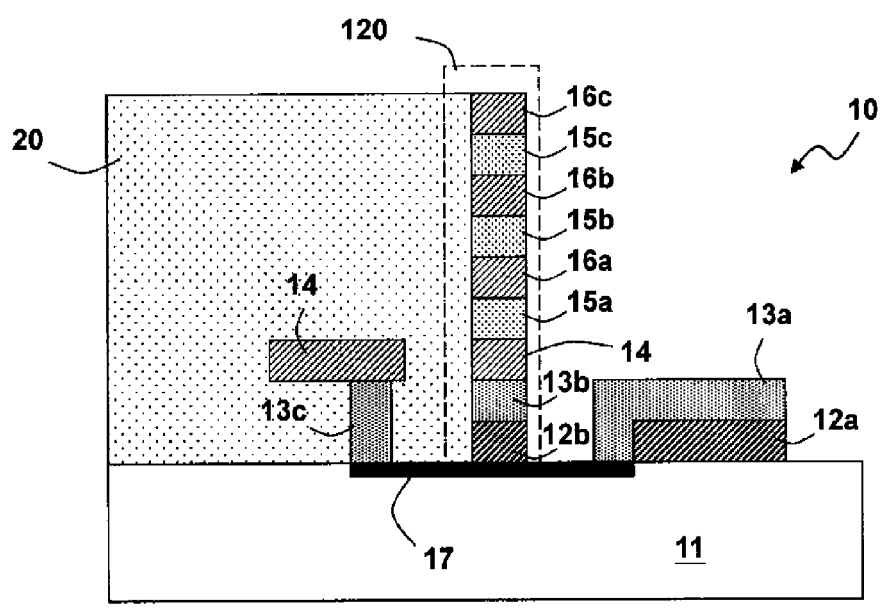

FIG. 3 illustrates the second embodiment of the present invention. In this embodiment, the contact layer 13a is used as a conducting wire (connection line, not only a plug) in the MEMS device area 100, and the structural layer 12a (such as an undoped polysilicon layer or a layer made of any other material capable of providing electrical isolation) is provided for electrical isolation between the contact layer 13a and the substrate 11. Yet, the cross-area connection between the MEMS device and the microelectronic device is achieved by a conductive layer 17 on the surface of the substrate 11; the conductive layer 17 for example can be made of cobalt silicide ($CoSi_2$), titanium silicide ($TiSi_2$), or other materials commonly used in the bottom of a contact layer to increase conductivity thereof. Since the cross-area interconnection does not go through the guard ring 120 but goes under it, the contact layer 13b and the structural layer 12b in the guard ring 120 can form a tightly closed structure with other portions thereof. The structural layer 12b is preferably a dielectric layer or a layer with dielectric function, so that the guard ring 120 is not short-circuited to the conductive layer 17; but it should be formed by a material other than that for the dielectric layer 20. For example, the dielectric layer 20 can be made of silicon dioxide, and the structural layer 12b can be made of silicon nitride, silicon oxynitride, etc. In a preferable embodiment, the structural layer 12b is made of undoped polysilicon, for better process integration. In the microelectronic device area 200, the conductive layer 17 can be electrically connected to the microelectronic devices through interconnection formed by the contact layer 13c, the metal layer 14, etc.

Figure 4:
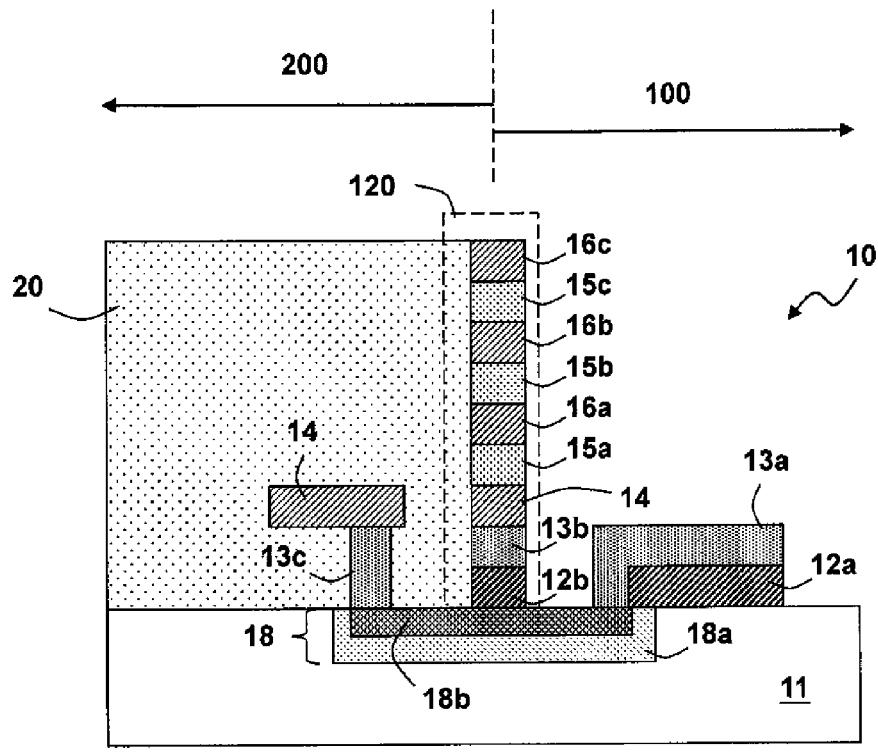

FIG. 4 illustrates the third embodiment of the present invention. In this embodiment, the contact layer 13a is also used as the conducting wire in the MEMS device area 100, and the structural layer 12a (such as an undoped polysilicon layer or a layer made of any other material capable of providing electrical isolation) is provided as the electrical isolation between the contact layer 13a and the substrate 11. Yet, the cross-area interconnection of the MEMS device and the microelectronic device is achieved by a well 18 in the substrate 11. The well 18 for example includes an N type well 18a and a heavily doped N+ well 18b above the N type well 18a, and the substrate 11 for example can be a P type substrate. A junction diode is formed between the N type well 18 and the P type substrate 11 to avoid short circuit. Similarly, since the cross-area interconnection does not go through the guard ring 120 but goes under the guard ring 120, the contact layer 13b and the structural layer 12b (such as an undoped polysilicon layer) in the guard ring 120 can form a tightly closed structure with other portions thereof.

Figure 5:
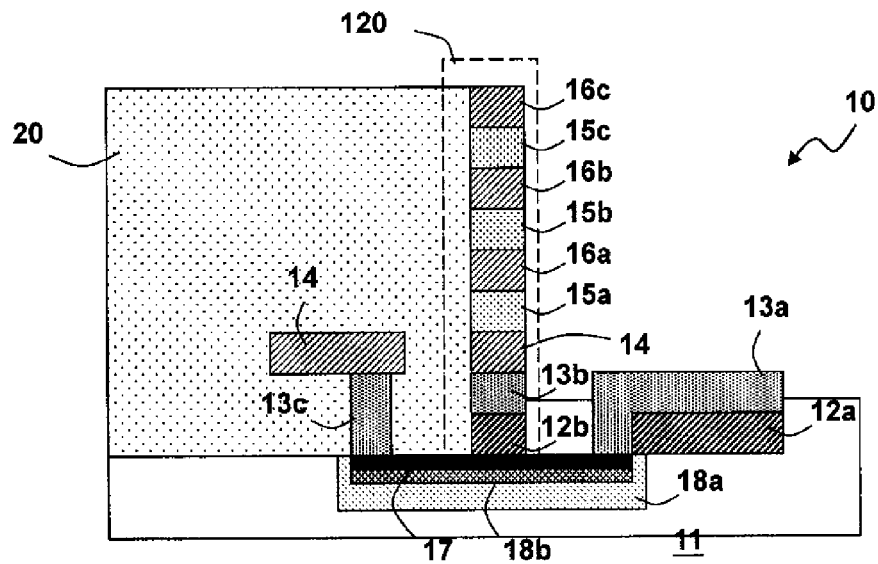

FIG. 5 illustrates the fourth embodiment of the present invention. In this embodiment, other than the conductive layer 17 for cross-area interconnection between the MEMS device and microelectronic device, an N type well 18 is also provided to form a junction diode with the P type substrate for avoiding short circuit. Similarly, since the cross-area interconnection does not go through the guard ring 120 but goes under the guard ring 120, the contact layer 13b and the structural layer 12b (such as an undoped polysilicon layer) in the guard ring 120 can form a tightly closed structure with other portions thereof.

Figure 6:
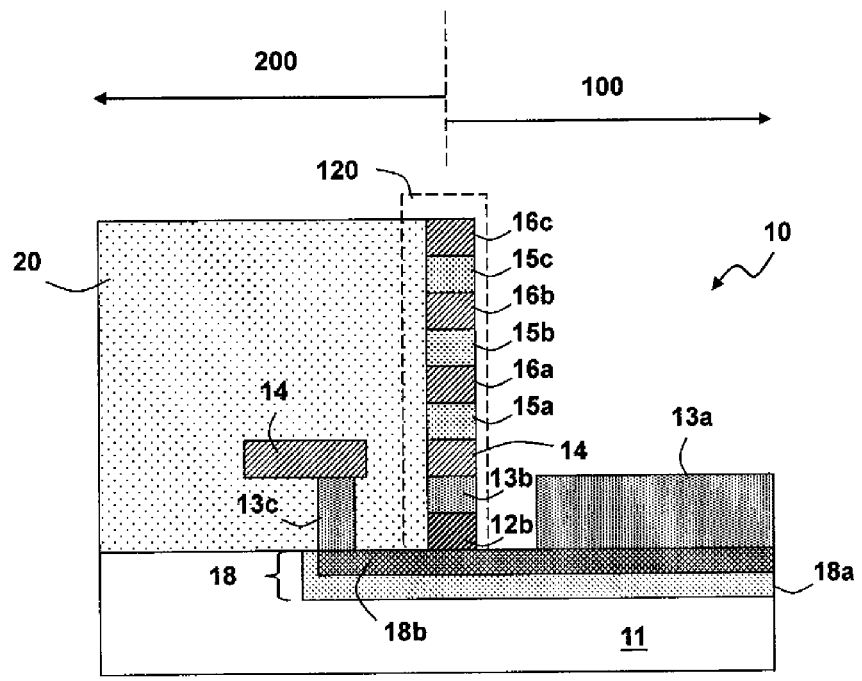

FIG. 6 illustrates the fifth embodiment of the present invention. In this embodiment, the junction diode formed between the N type well 18 and the P type substrate 11 extends to the MEMS device area 100; therefore, the undoped polysilicon layer for electrical isolation may not be required in the MEMS device area 100. The contact layer 13a can contact the N type well 18 directly.

Figure 7:
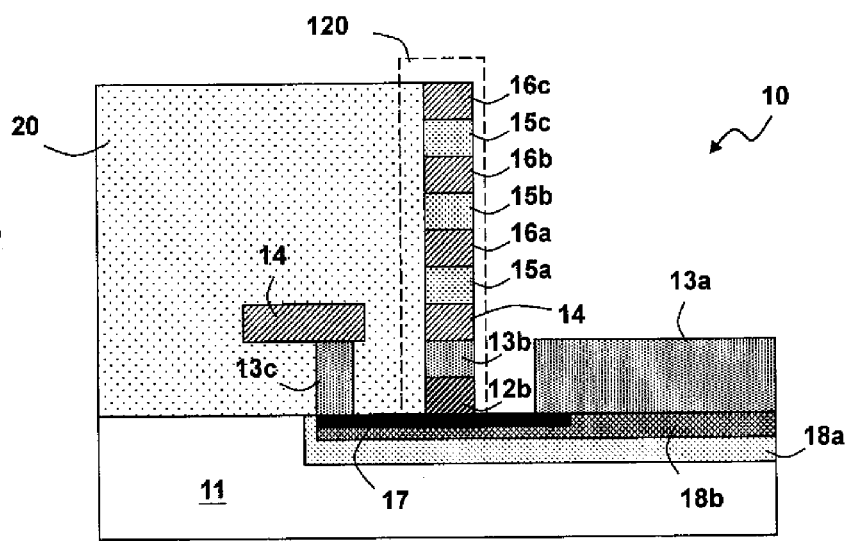

FIG. 7 illustrates the sixth embodiment of the present invention. This embodiment is similar to the former embodiment. The junction diode formed between the N type well 18 and P type substrate 11 extends to the MEMS device area 100; hence, the undoped polysilicon layer for electrical isolation may not be required in the MEMS device area 100. The cross-area interconnection between the MEMS device and microelectronic device further includes the conductive layer 17.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, the materials, number of the metal layers, etc. of each foregoing embodiment can be modified without departing from the spirit of the present invention. Furthermore, the microelectronic devices integrated with the MEMS device are not limited to CMOS devices; they can include bipolar junction transistors (BJTs) and other devices. In view of the foregoing, the spirit of the present invention should cover all such and other modifications and variations, which should be interpreted to fall within the scope of the following claims and their equivalents.

What is claimed is:

1. A MEMS integrated chip with cross-area interconnection, comprising:
   a substrate;
   a MEMS device area on the substrate;
   a microelectronic device area on the substrate;
   a guard ring separating the MEMS device area and the microelectronic device area at two sides of the guard ring; and
   a silicide layer below the guard ring and on the substrate, the silicide layer extending to two sides of the guard ring;
   a first contact layer in the MEMS device area, which is electrically connected with the silicide layer;
   a structural layer between the first contact layer and the, substrate, for providing electrical isolation between the contact layer and the substrate; and
   an interconnection in the microelectronic device area, which is electrically connected with the silicide layer, the interconnection including a second contact layer and a metal layer, wherein the second contact layer is below and electrically connected with the metal layer.

2. The MEMS integrated chip of claim 1, further comprising a well in the substrate below the silicide layer.

3. The MEMS integrated chip of claim 1, wherein the first contact layer is used as a conducting wire in the MEMS device area.

* * * * *